Figure 1:
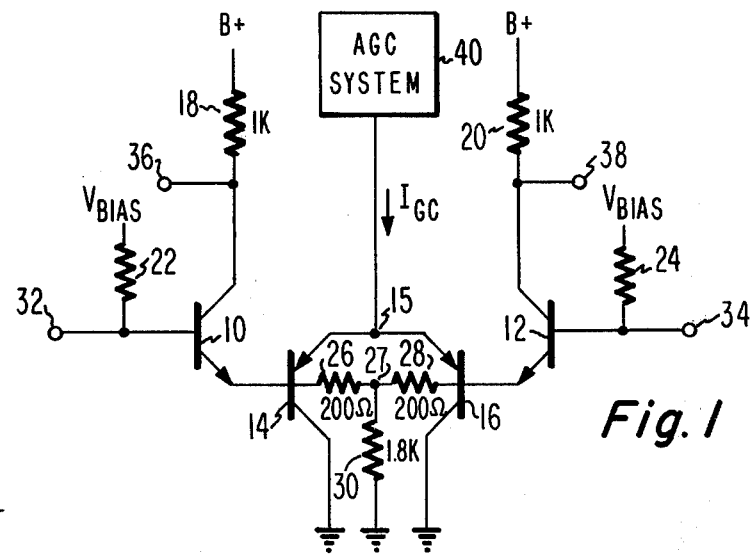

United States Patent [19]

Harford

[11] 4,345,214

[45] Aug. 17, 1982

[54] VARIABLE EMITTER DEGENERATION GAIN-CONTROLLED AMPLIFIER

[75] Inventor: Jack R. Harford, Flemington, N.J.

[73] Assignee: RCA Corporation, New York, N.Y.

[21] Appl. No.: 143,035

[22] Filed: Apr. 23, 1980

[51] Int. Cl.[3] ............................................. H03F 3/45
[52] U.S. Cl. .................................... 330/254; 330/283
[58] Field of Search ............................... 330/254, 283

[56] References Cited

U.S. PATENT DOCUMENTS

| 69,133 | 9/1866 | Adamczyk | |
|---|---|---|---|
| 3,641,450 | 2/1972 | Lunn | 330/254 |
| 3,700,937 | 12/1972 | Hanna | 330/283 |
| 3,942,181 | 3/1976 | Berrod et al. | 330/254 |
| 4,131,809 | 12/1978 | Baars | 307/303 |
| 4,267,518 | 5/1981 | Davis | 330/254 |

FOREIGN PATENT DOCUMENTS

| 906939 | 9/1962 | United Kingdom . |
| 952904 | 3/1964 | United Kingdom . |
| 1288880 | 9/1972 | United Kingdom . |
| 1430618 | 3/1976 | United Kingdom . |
| 1519831 | 8/1978 | United Kingdom . |
| 2013431A | 8/1979 | United Kingdom . |

OTHER PUBLICATIONS

Schatter, E., "Monolithic TV IF System TBA 440", IEEE Trans. on BTR, vol. BTR-18, No. 3, Aug. 1972, p. 158.

Krisilov, JVD. "Automatic Control and Stabilization of Amplification in Transistor Circuits" Soviet Radio 1974, p 133.

Primary Examiner—James B. Mullins
Assistant Examiner—Gene Wan
Attorney, Agent, or Firm—Paul J. Rasmussen; William H. Meagher; W. Brinton Yorks, Jr.

[57] ABSTRACT

A gain-controlled amplifier is provided in which emitter degeneration is varied without affecting the D.C. biasing of the amplifier. An amplifying transistor is resistively coupled in a common emitter amplifier configuration with a fixed collector load resistor. The emitter impedance of the amplifying transistor includes a controlled resistance device having a base electrode coupled to the emitter electrode of the amplifying transistor, an emitter electrode coupled to receive a variable gain controlling current and a collector electrode coupled to a point of reference potential. At signal frequencies, the base-to-emitter junction of the device acts as a resistance which varies inversely with the flow of gain controlling current through the collector-to-emitter path of the device. Varying the resistance of the base-to-emitter junction of the device varies the emitter impedance and the degeneration of the amplifying transistor, which varies the gain of the amplifier. The collector-to-emitter path of the device is separate from the transistor biasing circuitry, and hence modulation of the device will not affect the D.C. biasing of the amplifying transistor. Under strong signal (maximum gain reduction) conditions, the controlled resistance device is turned off completely so that it will not introduce intermodulation distortion into the amplifier. The fixed collector load resistor provides a constant, high output impedance, which reduces power dissipation and signal currents flowing in the amplifier power supply.

10 Claims, 2 Drawing Figures

VARIABLE EMITTER DEGENERATION GAIN-CONTROLLED AMPLIFIER

This invention relates to transistor amplifier circuits and, more particularly, to a gain-controlled transistor amplifier circuit in which emitter degeneration is varied without upsetting the D.C. biasing of the amplifier.

A gain-controlled amplifier, such as the intermediate frequency (I.F.) amplifier of a television receiver, should be capable of satisfying a wide variety of often conflicting performance requirements. For instance, the amplifier should be capable of linear operation over the full range of controlled amplification. The input impedance and the D.C. biasing of the amplifier should be constant over the amplification range. Additionally, the input signal handling capability should be sufficient to prevent overload by high level input signals, and the signal-to-noise performance of the amplifier should be optimized.

These performance requirements are satisfactorily met in the gain-controlled amplifier described in my U.S. patent application Ser. No. 143,032, entitled "VARIABLE LOAD IMPEDANCE GAIN-CONTROLLED AMPLIFIER", concurrently filed herewith. The amplifier described in that patent application utilizes a controlled resistance device to vary the collector load impedance and hence the load line of the amplifier in response to a gain control signal. This amplifier is particularly advantageous in that the resistance of the collector load device is varied by the gain control signal without upsetting the D.C. biasing of the amplifying transistor.

When the amplifier described in the above-mentioned patent application is used as a first or intermediate stage in a television I.F. amplifying section including a number of cascaded stages, it performs admirably. This is due, in part, to the use of the variable collector load, which improves the signal-to-noise performance of the amplifier under strong signal (minimum gain) conditions. Under these conditions, during which the signal-to-noise performance of the amplifier is most important, noise-generating resistances at the outputs of the amplifier are reduced. However, this mode of operation has been found to be undesirable when the amplifier is used as the final, or output, stage of the cascaded amplifiers. In the output stage, signal-to-noise performance is less significant because the amplifier is receiving relatively high level signals from the preceding amplifier stages. A more important criterion for the output stage is the ability to amplify these high level signals to even higher levels in a distortionless manner, while minimizing the power dissipation of the amplifier. In particular, it has been found that, at the high signal levels at the output of the final stage, the PIN junctions of the collector-connected controlled resistance devices are driven sufficiently hard so that they approach conditions at which intermodulation occurs. Furthermore, the gain of the amplifier is reduced in the presence of strong signals by reducing the resistance of the PIN junctions at the collector electrodes of the amplifying transistors. In order to provide the required high level output signals, high signal currents must be provided to adequately drive the low resistance collector loads. This can lead to large signal currents on the amplifier power supply, resulting in poor gain stability. Accordingly, it is desired to develop an amplifier which retains the benefits of the aforedescribed amplifier, while improving the distortionless operation and reducing the power dissipation of the amplifier under strong signal conditions.

In accordance with the principles of the present invention, a gain-controlled amplifier is provided in which emitter degeneration is varied without affecting the D.C. biasing of the amplifier. An amplifying transistor is resistively coupled in a common emitter amplifier configuration with a fixed collector load resistor. The emitter impedance of the amplifying transistor includes a controlled resistance device having a base electrode coupled to the emitter electrode of the amplifying transistor, an emitter electrode coupled to receive a variable gain controlling current and a collector electrode coupled to a point of reference potential. At signal frequencies, the base-to-emitter junction of the device acts as a resistance which varies inversely with the flow of gain controlling current through the collector-to-emitter path of the device. Varying the resistance of the base-to-emitter junction of the device varies the emitter impedance and the degeneration of the amplifying transistor, which varies the gain of the amplifier. The collector-to-emitter path of the device is separate from the transistor biasing circuitry, and hence modulation of the device will not affect the D.C. biasing of the amplifying transistor. Under strong signal (maximum gain reduction) conditions, the controlled resistance device is turned off completely so that it will not introduce intermodulation distortion into the amplifier. The fixed collector load resistor provides a constant, high output impedance, which reduces power dissipation and signal currents flowing in the amplifier's power supply.

The amplifying transistor of the gain-controlled amplifier will typically exhibit a certain amount of collector-base capacitance, which can adversely affect the performance of the amplifier when used as an I.F. amplifier in a television receiver. The I.F. amplifier in a television receiver is usually preceded by frequency-selective circuitry which shapes the I.F. passband. When the I.F. signals are coupled from this circuitry to the base of the amplifying transistor, the effective input capacitance, which is a function of the collector-base capacitance and the voltage gain of the amplifying transistor will be seen at the output of the selectivity circuitry as a part of the input impedance of the amplifier. As the gain of the amplifier is increased, the apparent input capacitance increases, and this increased capacitance will detune the selectivity circuitry to a lower frequency. In the television receiver, this detuning will effectively tune the selectivity circuitry away from the picture carrier and toward the color carrier. This will effectively reduce the signal level and the signal-to-noise ratio of the video information. Thus, it is desirable to design the gain-controlled amplifier so that the input impedance of the amplifier remains constant over the full range of gain control. In accordance with a further aspect of the present invention, the input of the amplifying transistor is buffered by the addition of an emitter-follower coupled transistor, which isolates the collector-base capacitance from the preceding circuitry.

Figure 2:
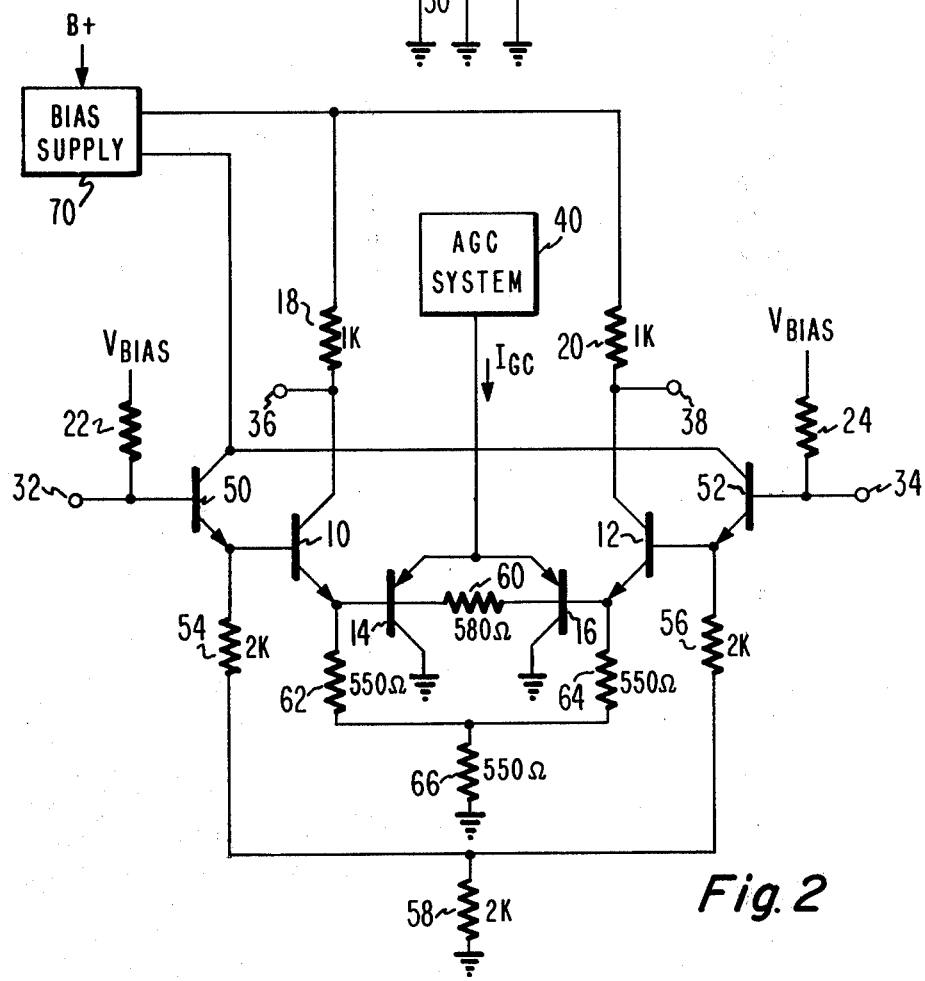

In the drawings:

FIG. 1 illustrates, partially in schematic diagram form and partially in block diagram form, a differential gain-controlled amplifier constructed in accordance with the principles of the present invention; and FIG. 2 illustrates, partially in schematic diagram form and partially in block diagram form, a second embodiment of the present invention which utilizes input buffering.

Referring to FIG. 1, a gain-controlled differential amplifier is shown, including amplifying transistors 10 and 12. An input signal is applied between the base electrodes of the amplifying transistors at terminals 32 and 34, and the amplified output signal is derived between the collector electrodes of the two transistors at terminals 36 and 38. Load resistors 18 and 20 are coupled between the respective collector electrodes of the amplifying transistor and a source of supply voltage (B+). Base bias for transistors 10 and 12 is supplied by resistors 22 and 24, which are coupled between the respective base electrodes and a bias voltage source ($V_{BIAS}$). The emitters of the two amplifying transistors are coupled together by two resistors 26 and 28. A resistor 30 is coupled between the junction 27 of resistors 26 and 28 and a point of reference potential (ground).

The emitter electrodes of transistors 10 and 12 are also coupled to the base electrodes of controlled resistance devices 14 and 16, respectively. The controlled resistance devices have collector electrodes coupled to ground, and joined emitter electrodes. An AGC system 40 is coupled to the joined emitter electrodes of the controlled resistance devices and supplies gain control current $I_{GC}$ to the devices.

The controlled resistance devices 14 and 16 may comprise ordinary transistors and, in a preferred embodiment of the present invention, will operate in the same manner as the controlled resistance devices described in my U.S. patent application Ser. No. 143,033, entitled "GAIN-CONTROLLED AMPLIFIER USING A CONTROLLABLE ALTERNATING-CURRENT RESISTANCE", concurrently filed herewith. Briefly, the devices are constructed in a similar manner as a vertical PNP transistor, with the base regions comprising regions of substantially intrinsic (high resistivity) semiconductive material. This intrinsic region separates the P+ emitter region and an N+ base contact region by a distance which is greater than the diffusion length of minority carriers injected into the intrinsic region from the emitter region in response to the emitter-to-collector flow of gain controlling current $I_{GC}$. The emitter-base junction of the device thus acts as a nonrectifying PIN diode to high frequency (i.e., greater than one Megahertz) signals. The resistance of the emitter-base junction of the device is controlled by the flow of $I_{GC}$ current from the AGC system 40, and will decrease as the flow of $I_{GC}$ current increases. Substantially all of the $I_{GC}$ current flows in the emitter-to-collector path of the device, with only a small D.C. current flowing in the base of the device. This base current is insignificant by comparison with the emitter currents of transistors 10 and 12, and hence will not upset the D.C. biasing of the amplifying transistors 10 and 12.

The differential amplifier configuration of FIG. 1 is balanced about junction points 15 and 27 at the center of the arrangement. These junction points will therefore be virtual signal null points for complementary input signals applied to terminals 32 and 34. With these points being virtual signal ground points, transistor 10 effectively has an emitter impedance for A.C. signals comprising the base-to-emitter resistance of device 14 in parallel with resistor 26, coupled between the emitter of the transistor and signal reference potential. Likewise, the A.C. emitter impedance of transistor 12 comprises the parallel combination of resistor 28 and the base-to-emitter junction of device 16. Resistor 30 completes the D.C. emitter biasing paths for the two transistors.

In operation, the AGC system 40 will respond to the reception of low level input signals by increasing the flow of gain controlling current $I_{GC}$. The large $I_{GC}$ will reduce the resistances of the base-to-emitter junctions of devices 14 and 16. These reduced resistances will be in parallel with resistors 26 and 28, respectively, and the parallel impedances will develop low signal impedances between the emitters of the transistors and signal ground. The low emitter impedances will cause transistors 10 and 12 to operate in a high gain condition to greatly amplify the low level input signals.

As the input signal levels increase, the AGC system 40 will respond by reducing the $I_{GC}$ current to the controlled resistance devices. This will increase the resistances of the base-to-emitter junctions of the devices, which will increase the A.C. emitter impedances of the transistors and hence reduce the gain of the amplifying transistors. At maximum gain reduction (minimum gain condition), $I_{GC}$ will be reduced to zero, and the transistor emitter impedances will be substantially equal to the values of resistors 26 and 28 for A.C. signals.

In the arrangement of FIG. 1, the collector-base capacitance of the amplifying transistors 10 and 12 may degrade the performance of the amplifier when used as an I.F. amplifying stage in a television receiver. Feedback due to this capacitance can reduce the gain of the amplifier, and the changing impedance at the input electrodes can detune the selectivity of preceding circuits which are coupled to terminals 32 and 34. In the arrangement of FIG. 2, these effects of the collector-base capacitance are reduced. Components of FIG. 2 performing the same function as those in FIG. 1 bear the same reference numerals.

In the arrangement of FIG. 2, amplifying transistors 10 and 12 are buffered at their base inputs by emitter-follower coupled transistors 50 and 52. Terminal 32 and bias resistor 22 are coupled to the base of transistor 50, the emitter of which is coupled to the base of transistor 10 and a resistor 54. Terminal 34 and bias resistor 24 are coupled to the base of transistor 52, the emitter of which is coupled to the base of transistor 12 and to a resistor 56. Resistors 54 and 56 are joined together and are coupled to ground at their junction by a resistor 58.

The collectors of transistors 50 and 52 are coupled together, and receive supply voltage from a bias supply 70. The bias supply 70 also provides supply voltage for collector load resistors 18 and 20.

Resistors 26 and 28 of FIG. 1 are replaced by a single resistor 60 in FIG. 2, which is coupled between the emitter electrodes of transistors 10 and 12. Resistor 62 and 64 are serially coupled between the emitters of transistor 10 and 12, and a resistor 66 is coupled between the junction of these two resistors and ground to complete the D.C. emitter biasing paths for transistors 10 and 12.

The effects of the collector-base capacitance of transistors 10 and 12 are present at the bases of these transistors. However, these effects are buffered from the input terminals 32 and 34 by the emitter-follower coupled transistors 50 and 52. The input impedance at the bases of transistors 50 and 52 remains substantially constant and high because the changing effect of the collector-base capacitance of transistors 10 and 12 during gain variation is effectively divided by the betas of the buffer transistors. The respective junctions of the emitters of transistors 50 and 52 and the bases of transistors 10 and 12 remain at a fixed D.C. bias level by virtue of the connection of bias resistors 54, 56 and 58.

As in the arrangement of FIG. 1, the gain of the amplifying transistors 10 and 12 of FIG. 2 is varied by controllably varying $I_{GC}$, which varies the base-to-emitter resistances of devices 14 and 16, and hence the emitter degeneration of the transistors. Resistor 60 is located at the center of the balanced configuration, and a signal null will be effectively developed at the center of this resistor for applied complementary input signals. Thus, half of the resistance of this resistor is effectively coupled between the emitter of each transistor 10 and 12 and a point of signal reference potential.

The performance of the gain-controlled amplifier of FIG. 2 may be illustrated by using the values of the resistive components illustratively shown in FIG. 2. For purposes of this example, it will be assumed that the amplifier is constructed entirely in integrated circuit form with the exception of the AGC system 40, and that the amplifier is to be used as the final output stage of a cascaded sequence of gain-controlled I.F. amplifiers for a television receiver. Because the amplifier is the I.F. output stage, it is to be capable of handling relatively high level input signals from the preceding amplifier stages. The amplifier is designed to provide a substantially constant level 60 millivolt signal RMS, as measured at the video signal sync tip, at output terminals 36 or 38. The amplifier is also designed to have a maximum gain of 20 db, and a gain reduction range of 10 db down from maximum gain. Impedances are to be kept high, to reduce the power dissipation and signal currents in the amplifier and its power supply.

Amplifying transistors 10 and 12 drive fixed one thousand ohm load resistors 18 and 20 to develop sixty millivolt output signals at terminals 36 and 38. In the gain-controlled amplifier described in the aforementioned patent application Ser. No. 143,032, the variable resistances of the controlled resistance devices 14 and 16 were in parallel with the fixed load resistors. At maximum gain reduction, these devices exhibited low resistances in that amplifier, which would require high signal drive currents to maintain the necessary 60 millivolt output signals. In the amplifier of FIG. 2, high signal drive currents are not required, since the output loads 18 and 20 are fixed, relatively higher impedances at maximum gain reduction.

When the amplifier of FIG. 2 is constructed in integrated circuit form, load resistors 18 and 20 will have parasitic capacitances in shunt with them, which reduce their impedances at signal frequencies. Typically, then, the load impedance of the amplifying transistors will be 700 ohms at I.F. signal frequencies when these capacitances are taken into consideration. For purposes of this example, the output impedances of the amplifying transistors will be assumed to be 700 ohms.

The D.C. biasing of transistors 10 and 12 is now chosen to provide substantially distortionless operation at the required power levels, as well as the desired gain and input signal handling capability. To deliver 60 millivolts to a 700 ohm load requires only about 120 μA of quiescent current. However, additional current is required in the amplifying transistor to reduce distortion of the signals. Approximately 300 μA is needed for reasonable linearity and required output power. But the inquiry does not end here, because gain and signal handling capability must also be considered.

The amplifier is required to provide 20 db of gain at maximum gain. The voltage gain of the amplifier is calculated as:

$$V_{GAIN} = Z_L/R_E \quad (1)$$

where $Z_L$ is the 700 ohm collector impedance, and $R_E$ is the sum of the dynamic emitter resistance (including contact resistance) of the amplifying transistor, $r_e$, and the A.C. resistance coupled between the emitter of the transistor and signal reference potential, $R_e$. Twenty db of gain will be achieved when $R_E$ equals 70 ohms for a 700 ohm load. The $r_e$ of the transistor is a function of the D.C. emitter current of the transistor, ranging from approximately 60 ohms at 0.5 ma. of emitter current to approximately 10 ohms at 3 ma. Since $R_E = r_e + R_e = 70$ ohms, a large $r_e$ must be offset by a reduced $R_e$. For instance, if the amplifying transistor is biased at 0.5 ma. of emitter current, $R_e$, which is the resistance of the base-to-emitter junction of the controlled resistance device in parallel with half the value of resistor 60 (290 ohms), must be 10 ohms. To achieve a 10 ohm value for $R_e$ required approximately 10 ma. of $I_{GC}$. This is an undesirably high value of $I_{GC}$, hence, in this example, the amplifying transistors are biased for 1.0 ma. of emitter current, resulting in an $r_e$ of approximately 30 ohms. The gain-controlled devices can now be controlled by $I_{GC}$ having a maximum value of 4 ma. to achieve the desired gain and range of gain reduction as shown in TABLE I.

TABLE I (values are for one side of the amplifier)

| Gain reduction Range (10 db) | $I_{GC}/2$ | $R_{14}$ or $R_{16}$ | $R_e(R_{14}$ or $R_{16})$ in parallel with 290 Ω | $R_E$ ($R_e + r_e$) |
|---|---|---|---|---|
| Max Gain (20 db) | 2 ma. | 48 Ω | 41 Ω | 71 Ω |
| ↓ | 1.76 ma. | 51 Ω | 43 Ω | 73 Ω |
| ↓ | 1.24 ma. | 70 Ω | 56 Ω | 86 Ω |
| ↓ | .73 ma. | 105 Ω | 77 Ω | 107 Ω |
| Min Gain (9.2 db) | .26 ma. | 240 Ω | 131 Ω | 161 Ω |
|  | 0.0 ma. | 800 Ω | 212 Ω | 242 Ω |

From equation (1), it may be seen that the maximum gain of the amplifier is $Z_L/R_E = 700/71 \approx 10 = 20$ db. At maximum gain reduction, the gain is $700/242 \approx 2.89 = 9.2$ db, thereby achieving a gain reduction range of just over 10 db. At high signal levels, the gain-controlled device is receiving no $I_{GC}$, and the emitter resistance coupled to the transistor is half the value of resistor 60 in parallel with the parasitic capacitance of the gain-controlled device. As seen in TABLE I, this parasitic capacitance is approximately an 800 ohm impedance at the I.F. signal frequencies in this example. Since the gain-controlled device is essentially shut off at maximum gain reduction when emitter signal levels are high, virtually no distortion will be introduced into the amplifier by the gain-controlled device at high signal levels.

The input signal handling capability of the amplifier is determined by the ratio of $r_e$ to $R_e$. The amplifying transistors are capable of dropping up to 13 millivolts of applied signal across their dynamic emitter resistances $r_e$, which are each 30 ohms in this example. The highest input signal levels will be received when the amplifier is in its minimum gain (maximum gain reduction) condition, at which time $R_e$ is approximately 242 ohms. Since $r_e$ and $R_e$ are in series with the applied signals, when 13 millivolts is dropped across $r_e$, approximately 105 millivolts will be dropped across the 242 ohm $R_e$:

$r_e/R_e + 30\Omega/242\Omega = 13\text{ mv}/105\text{ mv}$

Thus, the amplifier is capable of handling input signals of up to approximately 118 millivolts at each input terminal without significant distortion. In the present example, however, it is assumed that the input signal levels which are applied to the amplifier will never exceed 20 millivolts, which is well under the 118 millivolt limit.

The embodiments shown may also be operated as modulators. For modulator operation, the AGC system 40 which supplies control current $I_{GC}$ is replaced by an amplifier which supplies a modulated current $I_{gc}$, which is representative of a modulating information signal. The resistance of the controlled resistance devices 14 and 16 is then varied as a function of this modulated current, which varies the gain of the amplifying transistors 10 and 12 as a function of the information of the modulated current. A carrier signal is applied between input terminals 32 and 34, thereby producing a carrier which is amplitude modulated by the information of the modulated current between the output terminals 36 and 38.

What is claimed is:

1. A gain-controlled amplifier comprising:
an amplifying transistor having a base electrode coupled to receive input signals, a collector electrode at which output signals are derived, and an emitter electrode;
means, coupled to said base, emitter, and collector electrodes, for biasing said transistor;
a source of gain control current; and
means for controlling the gain of said transistor, having a first electrode coupled to said emitter electrode of said transistor, a second electrode coupled to said source for receiving said gain control current, and a third electrode coupled to a point of reference potential, said gain control current causing a flow of current through said third electrode which is substantially equal to the flow of gain control current at said second electrode, and a flow of current through said first electrode which is substantially less than said flow of gain control current at said second electrode, said first electrode of said means providing a gain-controlling impedance at said emitter electrode of said transistor which is variable as a function of the magnitude of said gain control current.

2. A gain-controlled amplifier comprising:
a first transistor having a base electrode coupled to receive input signals, a collector electrode at which output signals are derived, and an emitter electrode;
means, coupled to said base, emitter, and collector electrodes, for biasing said transistor;
a source of gain control current; and
a second transistor having a base electrode coupled to said emitter electrode of said first transistor to present a gain-controlling resistance thereat, a collector electrode coupled to a point of reference potential, and an emitter electrode coupled to said source to receive said gain control current, the resistance between said base and emitter electrodes being variable as a function of the magnitude of said gain control current to control the gain of said amplifier.

3. A gain-controlled differential amplifier comprising:
first and second transistors, each having a base electrode coupled to an input terminal, a collector electrode coupled to an output terminal, and an emitter electrode;
first and second impedances, each being coupled between a respective collector electrode of one of said first and second transistors and a source of supply potential;
a third impedance coupled between said emitter electrodes of said first and second transistor;
means, coupled between said emitter electrodes of said transistors and a point of reference potential, for biasing said transistors;
a source of gain control current; and
first and second controlled resistance devices each having a first electrode coupled to a respective emitter electrode of one of said first and second transistors to present a gain-controlling impedance thereat, a second electrode coupled to a point of reference potential, and a third electrode coupled to said source of gain control current, each of said devices exhibiting a gain-controlling impedance between said first and third electrodes which varies as a function of changes in the magnitude of the gain control current flow between said second and third electrodes, the flow of D.C. current through said second electrode and said third electrode being of substantially equal magnitudes, and the flow of D.C. current through said first electrode being substantially less than said substantially equal magnitudes.

4. A gain-controlled differential amplifier comprising:
first and second transistors, each having a base electrode coupled to an input terminal, a collector electrode coupled to an output terminal, and an emitter electrode;
first and second impedances, each being coupled between a respective collector electrode of one of said first and second transistors and a source of supply potential;
a third impedance coupled between said emitter electrodes of said first and second transistors;
means, coupled between said emitter electrodes of said transistors and a point of reference potential, for biasing said transistors;
a source of gain control current; and
third and fourth transistors, each having a base electrode coupled to a respective emitter electrode of one of said first and second transistors to present a gain-controlling impedance thereat, a collector electrode coupled to a point of reference potential, and an emitter electrode coupled to said source to receive a gain control current, each of said third and fourth transistors exhibiting a base-to-emitter impedance which varies as a function of changes in the magnitude of said gain control current to control the gain of said amplifier.

5. In a television receiver, including an automatic gain control circuit which develops a control current for controlling the gain of an intermediate frequency amplifier, an intermediate frequency amplifier comprising:
first and second transistors, each having a base electrode coupled to an input terminal, a collector electrode coupled to an output terminal, and an emitter electrode;
first and second impedances, each being coupled between a respective collector electrode of one of said first and second transistors and a source of supply potential;

a third impedance coupled between said emitter electrodes of said first and second transistors;

means, coupled between said emitter electrodes of said transistors and a point of reference potential, for biasing said transistors; and first and second controlled resistance devices, each having a first electrode coupled to a respective emitter electrode of one of said first and second transistors to present a gain-controlling impedance thereat, a second electrode coupled to a point of reference potential, and a third electrode coupled to said automatic gain control circuit for receiving said control current, each of said devices exhibiting a gain-controlling impedance between said first and third electrodes which varies as a function of changes in the magnitude of the gain control current flow between said second and third electrodes, the flow of D.C. current through said second electrode and said third electrode being of substantially equal magnitudes, and the flow of D.C. current through said first electrode being substantially less than said substantially equal magnitudes.

6. In a television receiver, including an automatic gain control circuit which develops a control current for controlling the gain of an intermediate frequency amplifier, an intermediate frequency amplifier comprising:

first and second transistors, each having a base electrode coupled to an input terminal, a collector electrode coupled to an output terminal, and an emitter electrode;

first and second impedances, each being coupled between a respective collector electrode of one of said first and second transistors and a source of supply potential;

a third impedance coupled between said emitter electrodes of said first and second transistors;

means, coupled between said emitter electrodes of said transistors and a point of reference potential, for biasing said transistors; and third and fourth transistors, each having a base electrode coupled to a respective emitter electrode of one of said first and second transistors to present a gain-controlling impedance thereat, a collector electrode coupled to a point of reference potential, and an emitter electrode coupled to said automatic gain control circuit, each of said third and fourth transistors exhibiting a base-to-emitter impedance which varies as a function of changes in the magnitude of said control current to control the gain of said amplifier.

7. The arrangement of claims 3, 4, 5, or 6, further comprising fifth and sixth transistors, each of which has a base electrode coupled to one of said input terminals, an emitter electrode coupled to the base of one of said first and second transistors, respectively, and a collector electrode coupled to a source of supply potential.

8. The arrangement of claims 3, 4, 5, or 6, wherein said first and second impedances each comprises a load resistor, said third impedance comprises third and fourth serially-coupled resistors, and said biasing means comprises a fifth resistor coupled between the junction of said third and fourth resistors and a point of reference potential.

9. The arrangement of claims 3, 4, 5, or 6, wherein said first and second impedances each comprises a load resistor, said third impedance comprises a third resistor, and said biasing means comprises fourth and fifth resistors serially coupled between the emitter electrodes of said first and second transistors and a sixth resistor coupled between the junction of said fourth and fifth resistors and a point of reference potential.

10. A modulator circuit comprising:

a source of signals which are to be modulated;

first and second transistors, each having a base electrode coupled to said signal source, a collector electrode coupled to an output terminal, and an emitter electrode;

first and second impedances, each being coupled between a respective collector electrode of one of said first and second transistors and a source of supply potential;

means, coupled between said emitter electrodes of said transistors and a point of reference potential, for biasing said transistors;

a source of modulating current; and third and fourth transistors, each having a base electrode coupled to a respective emitter electrode of one of said first and second transistors to present a modulating impedance thereat, a collector electrode coupled to a point of reference potential, and an emitter electrode coupled to said modulating current source to receive a modulating current, each of said third and fourth transistors exhibiting a base-to-emitter impedance which varies as a function of changes in the magnitude of said modulating current to modulate said signals provided by said source.

* * * * *